United States Patent [19]

Koyanagi et al.

[11] Patent Number: 4,701,349

[45] Date of Patent: Oct. 20, 1987

[54] SEMICONDUCTOR INTEGRATED CIRCUIT DEVICE AND METHOD OF PRODUCING THE SAME

[75] Inventors: Mitsumasa Koyanagi; Hiroko Kaneko, both of Higashimurayama, Japan

[73] Assignee: Hitachi, Ltd., Tokyo, Japan

[21] Appl. No.: 806,342

[22] Filed: Dec. 9, 1985

[30] Foreign Application Priority Data

Dec. 10, 1984 [JP] Japan .............................. 59-259144

[51] Int. Cl.$^4$ .......................................... H01L 21/285
[52] U.S. Cl. ..................................... 427/228; 148/6.3; 156/664; 437/241
[58] Field of Search ................... 427/93, 88; 148/6.3; 156/664

[56] References Cited

U.S. PATENT DOCUMENTS 4,429,011  1/1984  Kim ..................................... 427/96
4,545,116  10/1985  Lau ..................................... 427/93

*Primary Examiner*—John D. Smith
*Attorney, Agent, or Firm*—Antonelli, Terry & Wands

[57] ABSTRACT

A silicide layer of a refractory metal for reducing resistance and a nitride layer for preventing diffusion of aluminum are formed on the source and drain regions of an MISFET. The silicide layer is formed in self-alignment with the source and drain regions by two annealings effected at a low temperature and at a high temperature, respectively, and has a low resistance. The nitride layer is formed by directly nitriding the silicide layer.

15 Claims, 17 Drawing Figures

SEMICONDUCTOR INTEGRATED CIRCUIT DEVICE AND METHOD OF PRODUCING THE SAME

BACKGROUND OF THE INVENTION

This invention relates generally to a semiconductor integrated circuit device, and more particularly to a semiconductor integrated circuit technique which is useful for increasing the density of integration and the reliability of a semiconductor integrated circuit device.

Wiring made of aluminum is connected to the source and drain regions formed on the main surface of a MISFET (Metal Insulator Semiconductor Field Effect Transistor) through contact holes. However, aluminum is easily diffused into the source and drain regions due to heat-treatment which is carried out in the production process of a semiconductor integrated circuit device (hereinafter referred to as an "IC"). Here, a problem is encountered that the source and/or drain region is electrically short-circuited to the semiconductor substrate by aluminum that has been diffused into the source and drain regions.

To prevent the diffusion of aluminum into the source and drain regions, a technique has been proposed which disposes a barrier metal between the aluminum wiring and the source and drain regions (C. Y. TING, "Thin Solid Films", Vol. 96, 1982, p 327). This barrier metal has a two-layered structure consisting of a titanium layer as a lower layer and a titanium nitride layer as an upper layer.

The inventors of the present invention have found it difficult to improve the integration density of IC by use of the barrier metal described above. The barrier metal must be formed to be greater than the contact hole in consideration of the variance of mask registration when forming the barrier metal. Moreover, a margin for the mask registration must be secured between the barrier metal formed on a drain region, for example, and a wiring to be connected to a source region. These make it difficult to improve the integration density of IC.

On the other hand, a technique is known which forms a titanium silicide layer on the upper surface of both the source and drain regions of MISFET in order to reduce their sheet resistance (R. D. Davies, "International Electron Devices Meeting, Technical Digest", p 714, 1982).

However, the inventors of the present invention have found that a titanium silicide layer can not be used as the barrier metal for the aluminum wiring because titanium silicide starts reacting with aluminum at about 450° C. Heat treatment at about 450° C. is conducted for a semiconductor chip after the aluminum wiring is formed, too.

SUMMARY OF THE INVENTION

It is an object of the present invention to provide a technique which can accomplish a higher integration density of IC.

It is another object of the present invention to provide a technique which can electrically isolate a semiconductor region to which a conductor layer such as a wiring is connected from other semiconductor regions in a satisfactory manner.

It is still another object of the present invention to provide a technique which furnishes a conductor layer, which is formed on the surface of a semiconductor region in order to reduce its resistance, with the function of preventing the diffusion of another conductor layer such as a wiring into the semiconductor region.

It is still another object of the present invention to provide a technique which forms the conductor layer having the function described above in self-alignment with a semiconductor region or with a contact hole.

It is still another object of the present invention to provide a technique which further reduces the resistance of the conductor layer formed on the surface of the semiconductor region.

It is still another object of the present invention to provide a technique which forms the conductor layer formed on the surface of the semiconductor region in self-alignment therewith, and further reduces the resistance of the conductor layer.

It is still another object of the present invention to provide a technique which reduces the resistance of the source and drain regions of an MISFET and improves the junction breakdown voltage.

It is a further object of the present invention to provide a technique which reduces the resistance of the source and drain regions and gate electrode of a MISFET.

These and other objects and novel features of the present invention will become more apparent from the following description to be taken in conjunction with the accompanying drawings.

Among the inventions disclosed herein, the following is a typical example.

A barrier metal is formed between a semiconductor region and a conductor layer such as a wiring in order to prevent the diffusion of aluminum constituting the conductor layer into the semiconductor region. The barrier metal consists of a silicide layer of a refractory metal that is formed in self-alignment with the semiconductor region, and a nitride layer of the refractory metal that is formed at least inside a contact hole.

The arrangement described above eliminates the margin for mask registration between the barrier metal and the contact hole and the margin for mask registration between the barrier metal and the conductor layer, and improves the integration density of IC's.

DESCRIPTION OF THE PREFERRED EMBODIMENTS

FIGS. 1 through 9 are drawings useful for explaining the first embodiment of the present invention, and are sectional views showing the principal portions of an IC during its production process.

Figure 1:
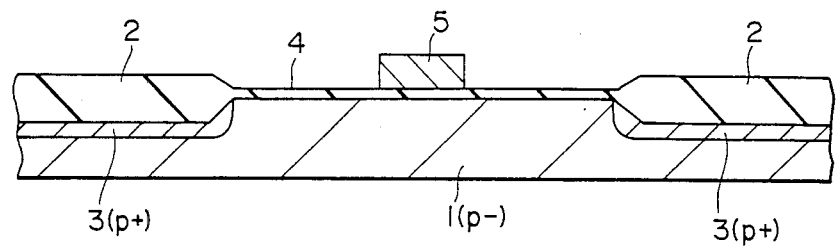
FIGS. 1 through 9 are sectional views, each showing the production steps in accordance with a first embodiment of the present invention.

First of all, a field insulating film 2 and a p+ type channel stopper region 3 are formed on a predetermined surface portion of a semiconductor substrate 1 consisting of p− type single crystal silicon, as shown in FIG. 1.

The field insulating film 2 is formed by first covering the upper surface of the semiconductor substrate 1 at the portions other than the portion, in which the field insulating film 2 is to be formed, with an oxidation impermeable mask, and then selectively oxidizing the upper surface of the semiconductor substrate 1. A silicon nitride film obtained by the CVD technique, for example, is used as the oxidation impermeable mask.

The channel stopper region 3 is formed by introducing in advance a p type impurity into the surface portion of the semiconductor substrate 1 before the field insulating film 2 is formed, and then diffusing the impurity during the thermal oxidation step which forms the field insulating film 2. The p type impurity is introduced by ion implantation, and the oxidation impermeable mask used for forming the field insulating film 2 and a photoresist used for forming the oxidation impermeable mask are employed as the mask for the ion implantation.

Next, the surface portion of the semiconductor substrate 1 between the field insulating films 2 is oxidized to form a gate insulating film 4.

Then, a polycrystalline silicon layer obtained by the CVD technique, for example, is deposited to the entire surface of the semiconductor substrate 1 in order to form a gate electrode 5. The gate electrode 5 is formed by selectively etching the unnecessary portions of this polycrystalline silicon layer.

Figure 2:
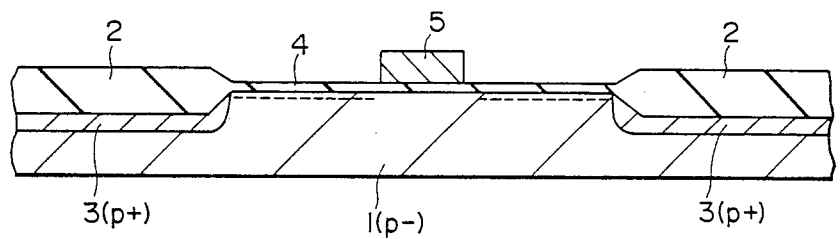

Next, an n type impurity such as phosphorus is ion-implanted into the surface portion of the semiconductor substrate 1 in a dosage of $1 \times 10^{15}$ cm$^2$ and at an energy of 50 KeV using the gate electrode 5 as a mask as shown in FIG. 2. This n type impurity is to form low impurity doped regions (n$^-$ regions) as part of the source and drain regions of the MISFET.

Figure 3:
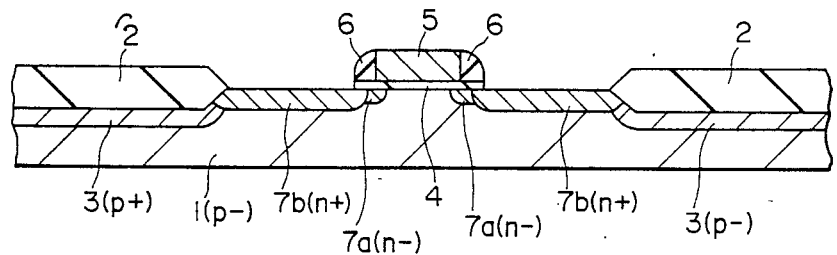

As shown in FIG. 3, a silicon dioxide film obtained by the CVD technique, for example, is formed on the entire surface of the semiconductor substrate 1 in order to form side wall spacers 6 on the side surfaces of the gate electrode 5. Since this silicon dioxide film is formed particularly thickly at the side of the gate electrode 5, the side wall spacers 6 can be formed by gradually removing the silicon dioxide film from its upper surface by reactive ion etching. When over-etching is effected during the formation of the side wall spacers 6, the gate insulating film 4 on the semiconductor substrate 1 is also removed.

Next, an n type impurity such as arsenic is introduced by ion implantation into the surface of the semiconductor substrate 1 using the gate electrode 5 and the side wall spacer 6 as the mask (in a dosage of $1 \times 10^{16}$ cm$^2$ and at an energy of 100 KeV). This n type impurity has a smaller diffusion coefficient than that of the n type impurity described already.

These two kinds of n type impurities, that have thus been introduced into the surface portion of the semiconductor substrate 1, are then diffused into the substrate by annealing the semiconductor substrate 1, thereby forming an LDD (Lightly Doped Drain) structure consisting of an n$^-$ type semiconductor region 7a and an n$^+$ type semiconductor region 7b. These semiconductor regions 7a and 7b are to be used as the source and drain regions of the MISFET, respectively.

Figure 4:
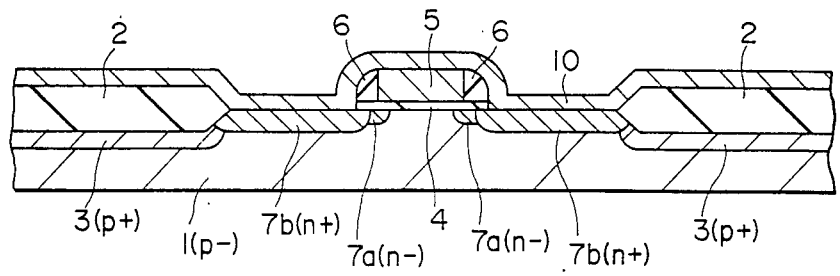

Next, as shown in FIG. 4, a 60 nm-thick refractory metal layer, such as a titanium layer 10, is formed on the entire surface of the semiconductor substrate 1 in order to form silicide layers 8, 9 of the refractory metal on the upper surfaces of the gate electrode 5 and the semiconductor region 7b. This titanium layer 10 is formed by sputtering, for example.

Next, the semiconductor region 7b and the titanium layer 10 are caused to react with each other by annealing in order to form a titanium silicide layer 9. Since the gate electrode 5 and the titanium layer on the former react with each other during this annealing process, the titanium silicide layer 8 can be formed on the gate electrode 5, too.

Figure 5:
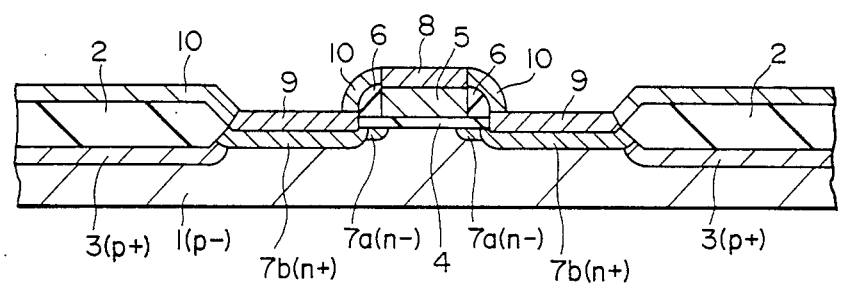
Figure 6:
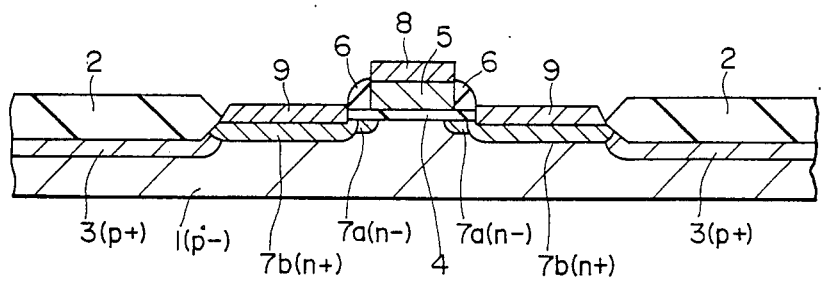
Figure 7:
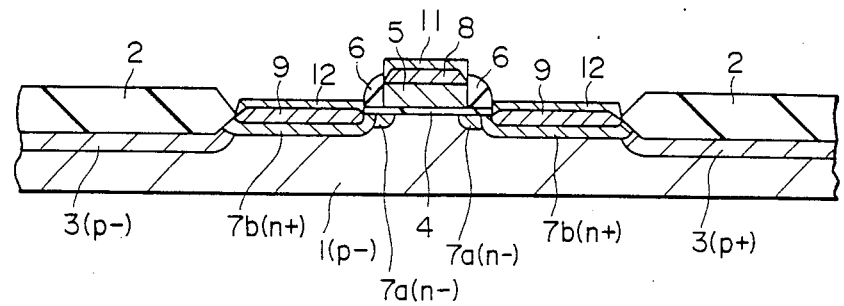

Preferably, annealing can be effected separately, twice in accordance with the sequences shown in FIGS. 5, 6 and 7.

As shown in FIG. 5, silicon and titanium are caused to react with each other by the first annealing. This annealing is effected preferably below 600° C. In this embodiment, this annealing is effected at 500° C. for 2 hours in a nitrogen or argon atmosphere. The titanium layer on the silicon dioxide films 2 and 6 does not react, and remains unchanged.

As a result of experiments, the inventors of the present invention have found that if the annealing temperature is below 600° C., the composition of the titanium silicide layers 8 and 9 comprises principally of TiSi and their resistance is relatively as great as 30Ω/□. Moreover, undesirable compounds such as TiSiO are not formed on the silicon dioxide films 2 and 6. The titanium silicide layers 8 and 9 are formed in self-alignment with (in substantially the same shape as) the exposed silicon layers 5 and 7b but are not formed on the other portions.

Next, as shown in FIG. 6, the unnecessary titanium layer 10 on the field insulating film 2 and on the side wall spacers 6 is removed selectively by etching. An etching solution of a hydrogen peroxide type (such as an aqueous solution of H$_2$O$_2$:NH$_3$=1:1) can be used as the etching solution for this purpose. This etching solution does not act upon the titanium silicide (TiSi) layers 8 and 9. The titanium layer 10 can be removed without any residue from etching. The titanium silicide layers 8 and 9 are left on the silicon layers 5 and 7b.

If the annealing temperature for the first annealing is above 600° C., selective etching such as described above cannot be carried out. In such a case, an aqueous solution of hydrofluoric acid must be used as the etching solution, because TiSiO and the like that are formed on the silicon dioxide films 2 and 6 cannot be removed unless hydrofluoric acid is used.

However, hydrofluoric acid etches the titanium silicide layer, too. As a result, if hydrofluoric acid is used as the etching solution, the titanium silicide layers 8 and 9 are etched, too. On the other hand, when other etching solutions are used, the titanium silicide layers will be short-circuited by TiSiO that is left unetched and unremoved on the silicon dioxide films 2 and 6. In this case, a part of the titanium silicide layer, which comprises principally of TiSi$_2$, is sometimes formed on the silicon dioxide films 2 and 6, so that the titanium silicide layers will be short-circuited, too.

Next, as shown in FIG. 7, annealing is effected in an nitrogen atmosphere in order to reduce the resistance of the titanium silicide layers 8, 9 and to form titanium nitride layers 11, 12. This annealing serves as the second annealing for forming the titanium silicide layers and also as annealing for forming the titanium nitride layers.

As a result of experiments, the inventors of the present invention have found that after annealing above 600° C., the titanium silicide layer (TiSi) changes to a titanium silicide layer, comprising principally of TiSi$_2$, which has a low resistance of 2 to 3Ω/□. The surface of the titanium silicide layer changes to titanium nitride due to annealing above 900° C. in a nitrogen atmosphere.

Annealing shown in FIG. 7 is effected above 900° C. in nitrogen atmosphere.

This embodiment uses lamp annealing because annealing can be completed within a short period. Since this annealing is high temperature annealing above 900° C., arsenic used for forming the semiconductor region 7b is vaporized from the substrate during annealing. Therefore, the amount of vaporized arsenic is reduced by shortening the annealing time. Lamp annealing is effected at 900° C. for 10 seconds using a halogen lamp, for example.

The titanium silicide ($TiSi_2$) tends to be oxidized. Oxide of $TiSi_2$ contributes to increase the resistance of the silicide layer. Accordingly, oxygen is purged so as substantially not to exist in an annealing apparatus. For this purpose, the annealing apparatus is heated with low temperature below 200° C. before annealing for nitridation with such high temperature.

Since the vaporization of arsenic is thus minimized, it becomes possible to prevent the increase in the contact resistance between the titanium silicide layer 9 and the semiconductor region 7b and to prevent the junction depth of the semiconductor region 7b from becoming shallow. If the junction depth is shallow, a problem will occur in that the breakdown voltage of the PN junction between the semiconductor region 7b and the substrate 1 is reduced.

As a result of this annealing, the resistance of the titanium silicide layer is reduced to 2 to 3Ω/□, about 1/10 of the original resistance. This annealing can also change the titanium silicide layer 9 to the titanium nitride layer 12 from its surface. The titanium nitride layer is about 100 Å thick. Silicon that is to be contained in the titanium nitride layer 12 is precipitated into the titanium silicide layer 9 or into the substrate below the titanium silicide layer 9.

Since the sheet resistance of the titanium nitride layer 12 is greater (by about five times) than that of the titanium silicide layer 9, the titanium nitride layer is preferably thin in order to minimize the increase in the sheet resistance. However, it is possible to change the titanium silicide layer 9 as a whole to the titanium nitride layer 12 by sufficiently extending the annealing time.

As described above, the titanium silicide (TiSi) layer 9 formed on the upper surface of the semiconductor region 7b in self-alignment therewith and having a relatively great resistance is turned into the titanium silicide ($TiSi_2$) layer having a small resistance by annealing. In this manner, the titanium silicide layer (a first conductor layer) having a small resistance can be formed in self-alignment with the semiconductor region 7b.

Incidentally, the silicide layer (TiSi or $TiSi_2$) may be formed selectively on the semiconductor region 7b by CVD.

After the titanium silicide layer is formed in self-alignment with the semiconductor region 7b, the titanium silicide layer is annealed in the nitrogen gas to turn it to the titanium nitride layer 12. Therefore, the barrier metal (the second conductor layer) comprised of the titanium nitride layer 12 can be formed on the semiconductor region 7b without any margin for mask registration.

Furthermore, the transfer speed of electric signals to be transferred through the semiconductor region 7b can be improved by disposing the titanium silicide layer 9 (or the titanium nitride layer 12) having a smaller sheet resistance than that of the semiconductor region 7b on the upper surface of the semiconductor region 7b.

The transfer speed of electric signals to be transferred through the gate electrode 5 can be improved by forming the titanium silicide layer 8 (and the titanium nitride layer 11) on the gate electrode 5.

Furthermore, the titanium nitride layers 11, 12 can be formed by merely containing nitrogen in a gas by use of a heat-treating apparatus for forming the titanium silicide layers 8,9.

As described above, the embodiment is characterized in that the sheet resistance of both the semiconductor region 7b and the gate electrode 5 is reduced, and the barrier metal is formed in self-alignment with at least a part on the semiconductor region 7b.

Figure 8:
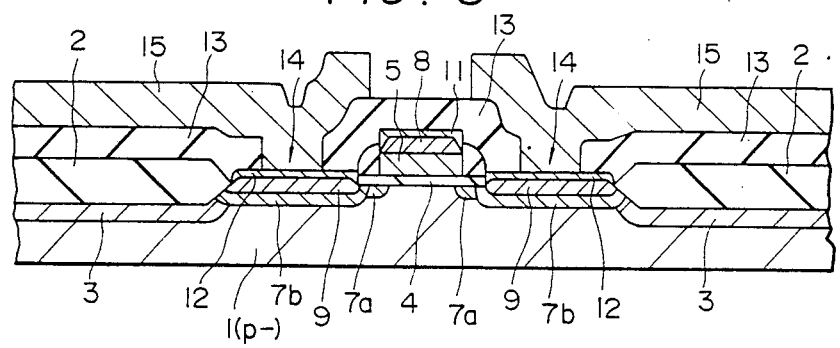

Next, an insulating film comprised of phosphosilicate glass (PSG) obtained by CVD, for example, is deposited over the entire surface of the semiconductor substrate 1 as shown in FIG. 8, and the insulating film 13 on the semiconductor region 7b is selectively removed to form a contact hole 14.

An aluminum layer is then formed on the entire surface of the semicondutor substrate 1 in order to form a (third) conductor layer 15. This alulminum layer is formed by sputtering, for example, and contains silicon in order to reduce diffusion into the semiconductor region 7b. The unnecessary portions of the aluminum layer are selectively removed by dry etching, for example, thereby forming the conductor layer 15.

Figure 9:
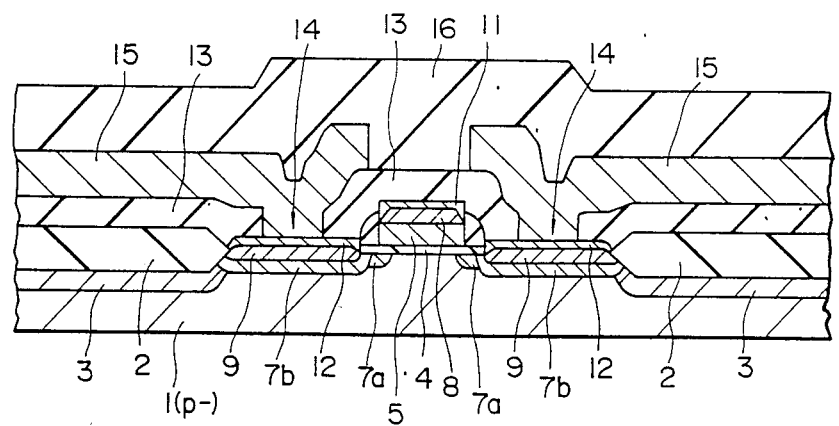

Next, as shown in FIG. 9, an insulating film 16 is formed on the semiconductor substrate 1 with a silicon dioxide film obtained by CVD, for example.

Since the barrier metal comprised of the titanium nitride layer 12 can be formed in self-alignment on the semiconductor region 7b, the margin for mask registration between the barrier metal and the conductor layer 15 is not necessary.

After the conductor layer 15 is thus formed, the semiconductor substrate 1 must be annealed in order to reduce the contact resistance between the conductor layer 15 and the semiconductor region 7b.

On the other hand, the insulating film 16 exhibits the effect of collecting impurity ions such as Na ions. However, this collecting effect will be reduced if the formation temperature of the insulating film 16 is low.

Therefore, even after the insulating film 16 is formed, the semiconductor substrate 1 is annealed to improve the effect of collecting the impurity ions with the insulating film 16.

Unless the titanium nitride layer exists, however, aluminum constituting the conductor layer 15 will be diffused into the titanium silicide layer 9 and further into the semiconductor region 7b during the annealing process for reducing the contact resistance between the semiconductor region 7b and the conductor layer 15. Aluminum that has thus been diffused into the semiconductor region 7b is likely to be further diffused into the semiconductor region 7b during the annealing process for promoting the collecting effect of the impurity ions by the insulating film 16. If aluminum is diffused into the semiconductor region 7b, a short-circuit is likely to occur between the semiconductor region 7b and the semiconductor substrate 1.

In this embodiment, however, since the grain size of the titanium nitride layer is smaller than that of the titanium silicide layer 9, a compact layer can be formed. Moreover, the titanium nitride layer 12 having a higher reaction temperature with aluminum than that of the titanium silicide layer 9 is interposed between the conductor layer 15 and the semiconductor region 7b.

Therefore, it is possible to prevent the diffusion of aluminum into the semiconductor region 7b during the annealing process, and hence the junction breakdown between the semiconductor region 7b and the semiconductor substrate 1 can be prevented.

The IC in accordance with this embodiment is completed by sealing the chip including of the semiconductor substrate 1 and the like from external air by a package after the insulating film 16 is formed. As one of the techniques of fixing the semiconductor substrate 1 to the package, there is a technique which subjects the package to friction together with a gold film so as to form a gold-silicon eutectic between them and to fix the package.

Since heat is applied, too, to the semiconductor substrate 1 during the formation process of this eutectic, it is likely that aluminum constituting the conductor layer 15 will be diffused into the semiconductor region 7b.

However, since the barrier metal comprising of the titanium nitride layer 12 is disposed on the semiconductor region 7b, this embodiment can prevent the diffusion of aluminum into the semiconductor region during the formation of the eutectic.

FIGS. 10 through 13 show the second embodiment of the present invention. This embodiment is characterized in that annealing for forming the titanium silicide ($TiSi_2$) layer is carried out separately from annealing for forming the titanium nitride layer, and that afater annealing for forming the titanium silicide ($TiSi_2$) layer is made, the semiconductor region 7b is then formed.

Figure 10:
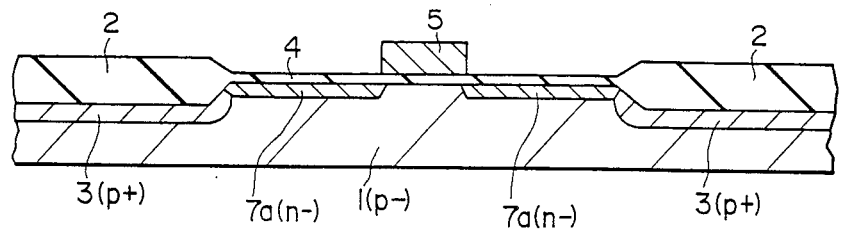
FIGS. 10 through 13 are sectional views, each showing the production steps in accordance with a second embodiment of the present invention.

After the steps of the first embodiment shown up to FIG. 2 are carried out, an n⁻ type semiconductor region 7a having a low impurity concentration is formed by annealing (FIG. 10).

Figure 11:
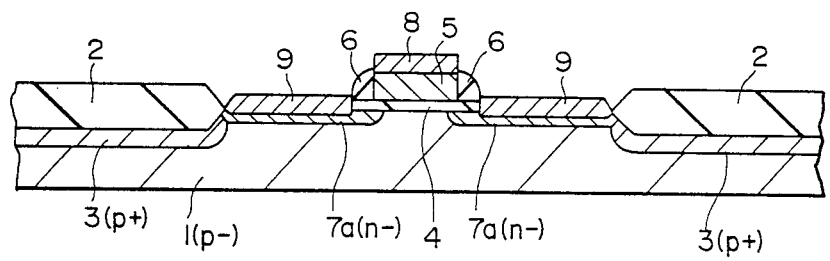

Next, the steps shown from FIG. 3 to FIG. 6 other than the introduction of an impurity and annealing to form the semiconductor region 7b are carried out, whereby the titanium silicide (TiSi) layer 8 and the titanium silicide (TiSi) layer 9 on the semiconductor region 7a are formed as shown in FIG. 11. The shapes of the titanium silicide layers 8 and 9 are determined by the silicon dioxide films 2 and 6 because only annealing below 600° C. is effected.

Figure 12:
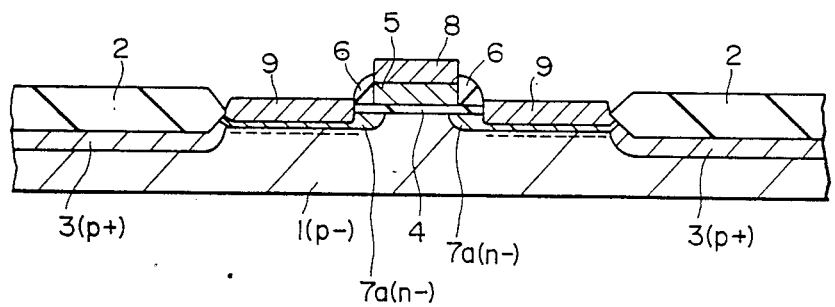

The second annealing is then carried out to form the titanium silicide ($TiSi_2$) layer. This is effected in a nitrogen (or argon) atmosphere at 700° C. for 50 minutes. Since the annealing temperature is lower than 900° C., titanium nitride is not formed. Thus, 120 nm titanium silicide ($TiSi_2$) layers 8 and 9 are formed in self-alignment with the silicon layer as shown in FIG. 12. Ion implantation of As ions is effected ($1 \times 10^{16}$ cm², 120 KeV) under this state in order to form the semiconductor region 7b. The As ions are introduced into the substrate using the gate electrode 5, the side wall spacers 6 and the field insulating film 2 as the mask as represented by dotted line in FIG. 12.

Figure 13:
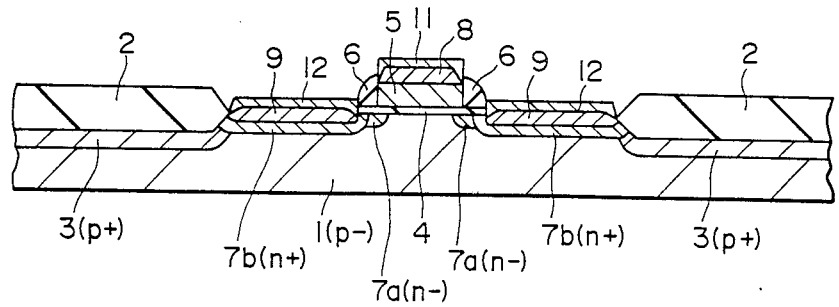

Next, annealing for forming titanium nitride is effected at 950° C. This annealing is lamp annealing in the same way as in the first embodiment. Thus, the titanium nitride layers 11 and 12 are formed in self-alignment with the titanium silicide layers 8 and 9 as shown in FIG. 13. This annealing activates the As ions that have been implanted, and the n+ type semiconductor region 7b is formed.

In this embodiment, annealing for reducing the resistance of the titanium silicide layer is carried out independently so that the thickness of the titanium silicide ($TiSi_2$) layer 9 can be controlled. Also, the thickness of the titanium nitride layer 12 can be controlled easily. Therefore, the overall resistance value can be reduced by increasing the thickness of the titanium silicide layer 9 and reducing that of titanium nitride layer 12.

According to this embodiment, arsenic has not yet been introduced into the substrate at the time of second annealing. Therefore, it is not necessary to take into consideration the evaporation of As at the time of annealing at a relatively high temperature of 700° C.

According to this embodiment further, the impurity concentration in the substrate is low at the time of annealing for forming the first and second titanium silicide layers. In other words, the n type impurity concentration is low in the region in which the titanium silicide layer 9 is to be formed. For this reason, the resulting titanium silicide layer can have a sufficient thickness. If silicon has an impurity concentration of at least about $10^{20}/cm^3$, the rate at which silicide is formed will be reduced. In accordance with this embodiment, however, the silicide layer can have a sufficient thickness because arsenic has not yet been introduced at the time of annealing, so that the resistance can be reduced.

Figure 14:
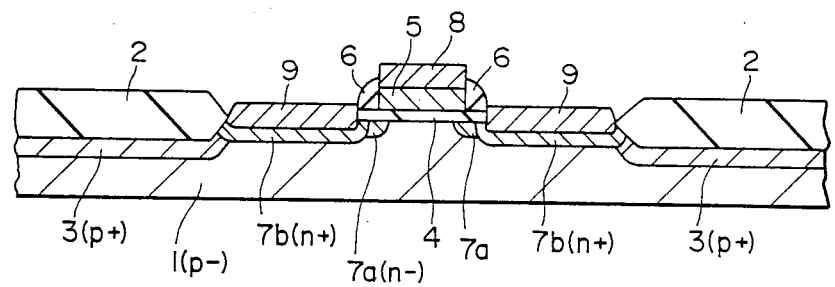
FIGS. 14 through 16 are sectional views, each showing the production steps in accordance with a third embodiment of the present invention.
Figure 15:
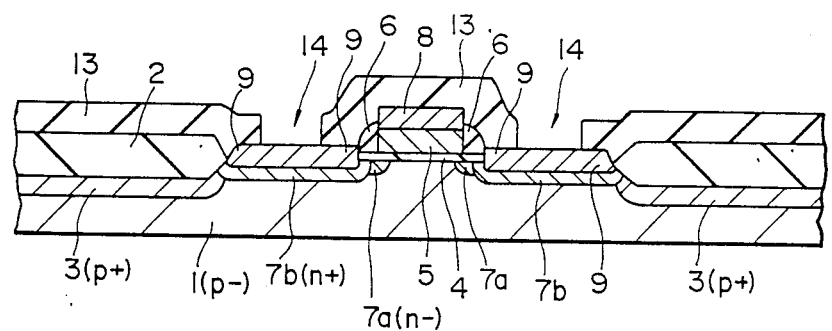
Figure 16:
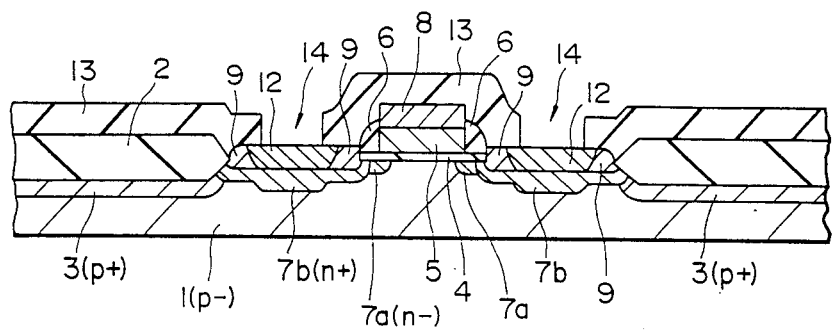

FIGS. 14 through 16 show the third embodiment of the present invention. In the third embodiment, after a contact hole 14 is formed, a titanium silicide layer exposed from the contact hole 14 is turned into a titanium nitride layer 12.

The semiconductor regions 7a, 7b and the titanium silicide ($TiSi_2$) layers 8, 9 shown in FIG. 14 are formed in the same way as in the first or second embodiment.

Next, FIG. 15 shows, that the insulating film 13 as well as the connecting hole 14 are formed similarly to the first embodiment.

Next, annealing (950° C., 30 minutes) is effected in an nitrogen atmosphere to turn the titanium silicide ($TiSi_2$) layer 9 exposed from the contact hole 14 to the titanium nitride layer 12.

In the third embodiment, the annealing time is sufficiently extended so that the titanium silicide layer 9 is changed into titanium nitride through the entire depth of the layer 12 shown in FIG. 16. The titanium nitride layer 12 is about 120 nm thick.

Incidentally, the titanium silicide layer 8 on the gate electrode 5 is not changed to the titanium nitride layer because it is covered with the insulating film 13.

Next, an n type impurity such as P is doped into the semiconductor region 7b by ion implantation through the contact hole 14 and further through the titanium silicide layer 9. Then, annealing is effected to diffuse the n type impurity into the semiconductor substrate 1.

It is possible to carry out ion implantation of P under the state shown in FIG. 15, that is, after the formation of the contact hole 14 but before the formation of the titanium nitride layer 12.

In this embodiment, the titanium nitride layer is formed by ordinary annealing but not by lamp annealing. Though the annealing time is long, arsenic is not diffused outside from the region covered with the insulating film 13 because the insulating film 13 functions as the cap. Arsenic is diffused outside only from the contact hole 14. An n type impurity is again introduced in order to compensate for the evaporation of the n type impurity through the contact hole 14. Doping of this impurity can be made sufficiently only through the contact hole 14. The semiconductor region formed by this doping need not be deeper than the semiconductor region 7b.

It is preferred to use P as an n type impurity. Even when annealed at a high temperature above 900° C., for example, P is mostly diffused into the silicon substrate but the quantity of diffusion outside the substrate is small.

Since the sheet resistance of the titanium nitride layer 12 is greater than that of the titanium silicide layer 9, the sheet resistance on the upper surface of the semiconductor region 7b is likely to increase. In this embodiment, however, only the titanium silicide layer 9 in the contact hole 14 is turned into the titanium nitride layer 12 so that the increase of the sheet resistance on the upper surface of the semiconductor region 7b due to the formation of the titanium nitride layer 12 can be prevented.

This embodiment is free from the reduction of the breakdown voltage in the backward occurred by the shallow junction of the source and drain regions.

In accordance with this embodiment, the sheet resistance after annealing at 950° C. is from 3 to 5$\Omega/\square$. If annealing is effected at 950° C. for 30 minutes without the insulating film 13, the sheet resistance is as great as about 14$\Omega/\square$. This difference becomes greater with a higher annealing temperature. The leakage current at the junctions between the source and drain regions is below $1 \times 10^{-10}$ A/mm. If only the titanium silicide (TiSi$_2$) layer exists without the titanium nitride layer, the leakage current is from 2.5 to $3 \times 10^{-10}$ (3.5 to $4 \times 10^{-10}$) A/mm. If neither the titanium nitride layer nor the titanium silicide layer exist, the leakage current is about $4 \times 10^{-10}$ ($1 \sim 1.5 \times 10^{-9}$) A/mm. The values without parentheses represent the values after annealing at 450° C. and those with parentheses represent the values after annealing at 500° C. In this embodiment, the leakage current does not increase even when the annealing temperature becomes high.

Figure 17:
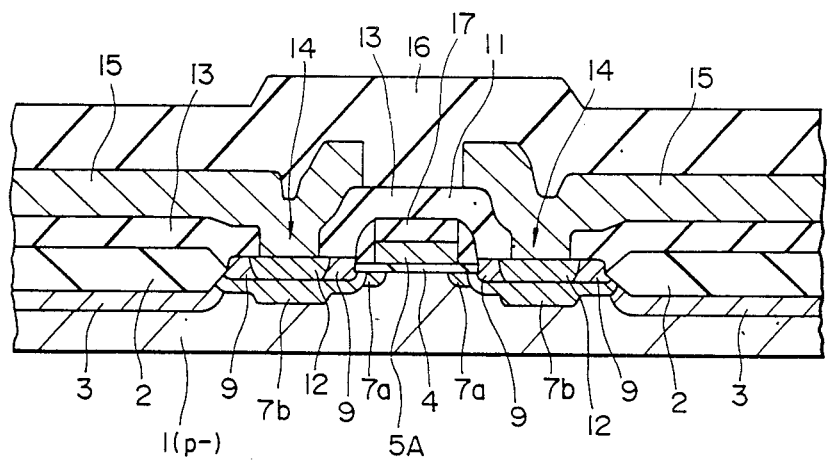
FIG. 17 is a sectional view showing a fourth embodiment of the present invention.

FIG. 17 is a sectional view of a fourth embodiment of the present invention. In this embodiment, the titanium silicide layer or the titanium nitride layer is not formed on the gate electrode.

In FIG. 17, the gate electrode 5A comprises polycrystalline silicon or a refractory metal such as W, Mo, Ta or Ti, or a silicide of such a refractory metal. The upper surface of the gate electrode 5A is covered with an insulating film 17 comprised of a silicon dioxide film or a PSG film lest the titanium silicide layer is formed on the gate electrode 5A.

The structure shown in FIG. 17 can be obtained in the following manner. After the gate insulating film 4 is formed, a conductor layer for forming the gate electrode 5A is formed by sputtering on the entire surface of the substrate. Subsequently, an insultaor for forming the insulating film 17 is formed by CVD on the entire surface of the conductor layer. These two layers are continuously etched by the photolithography technique. In this manner, a structure is obtained in which the gate electrode 5 of FIG. 1 is changed to 5A and the insulating film 17 having the same shape as that of the gate electrode 5A is formed on the gate electrode 5A. Thereafter, the IC shown in FIG. 17 can be obtained by following the subsequent procedures of the third embodiment.

In accordance with this embodiment, the silicide layer can be made sufficiently thick. This embodiment can prevent the contamination of the gate electrode and the change of a threshold voltage due to the formation of the silicide layer.

The novel techniques disclosed by the present invention can provide the following effects.

In the present invention, the silicide layer of the refractory metal is formed on the upper surfaces of the semiconductor regions of the MISFET such as the source and drain regions in self-alignment with the latter, and this silicide layer is annealed in the N-containing atmosphere and changed to a nitride. Therefore, the barrier metal comprising of the nitride can be formed on the semiconductor regions without the necessity for the mask registration margin. This means that the integration density of the IC can be improved.

Since the silicide layer of the refractory metal having a smaller sheet resistance than the semiconductor region can be formed in self-alignment on the upper surface of the semiconductor region, the transfer speed of electric signals to be transferred through the semiconductor region can be improved.

Since the silicide layer of the refractory metal is formed in self-alignment on the gate electrode, the transfer speed of electric signals to be transfered through the gate electrode can be improved.

The silicide layer can be turned into the nitride layer by heat-treatment using the heat-treating appartus used for forming the silicide layer of the refractory metal on the semiconductor region or on the gate electrode in the N-containing gas. Therefore, no particular apparatus for forming the nitride layer is necessary.

The nitride layer, which has a grain size smaller than that of the silicide layer of the refractory metal, which can therefore form a compact layer and which has a higher reaction temperature with alulminum than that of the silicide layer of the refractory metal, is sandwiched between the conductor layer and the semiconductor region which is in contact with the conductor layer. Therefore, it is possible to prevent the diffusion of aluminum into the semiconductor region during various annealing steps.

The n type impurity is again doped through the contact hole disposed on the semiconductor region to compensate for, that is, to increase, the impurity concentration of the semiconductor region at the lower part of the contact hole. This makes it possible to reduce the resistance between the semiconductor region and the silicide layer of the refractory metal formed on the former.

Annealing for forming the silicide layer of the refractory metal is separately carried out twice at a low temperature and a high temperature. This makes it possible to form the silicide layer in self-alignment with, and on, the semiconductor region.

The silicide layer of the refractory metal formed in self-alignment on the semiconductor region is directly nitrided, so that the brrier metal can be formed without any margin for mask registration.

The inter-layer insulating film is used as the annealing cap when nitridation is effected to form the barrier metal. This can prevent the diffusion of the impurity for forming the semiconductor region from outside the substrate.

The nitride film as the barrier metal is formed using the inter-layer insulating film, that has the contact hole, as the mask. Therefore, the increase in the sheet resistance of the semiconductor region can be prevented.

Although the present invention has thus been described with reference to some prefered embodiments thereof, it should be noted that the invention is not particularly limited thereto but can of course be practised in various modified forms without departing from the spirit and scope thereof.

For instance, the present invention can be applied to ICs equipped with P-channel MISFETs or both of N- and P-channel MISFETs. There is no problem in particular even when the MISFETs have structures other than the LDD structure. The sidewall spacers can be removed after the silicide layer is formed. The aluminum wiring layer may contain a small amount of impurities such as silicon and/or copper, and the like.

In order to turn the silicide layer of the refractory metal to its nitride layer, various methods may be employed such as a method using nitrogen plasma, a method using ammonia, or a method which introduces nitrogen atoms or modlecules by ion implantation. In the case of the method which uses plasma, the reaction speed with the silicide layer can be increased because the nitrogen is under excitation. Therefore, the time for forming the nitride layer can be reduced. Nitridatio is effected at 500° C. and for 30 min to form a 200 Å thick titanium nitride layer using $NH_3$ (ammonia) plasma (1.1 Torr, 500 W). The method using ammonia can prevent the damage of the insulating film 13 during the formation process of the nitride layer 12 because ammonia does not react with the insulating film 13. Nitridatio is effected above 950° C. in pure $NH_3$ atmosphere. The ion implantation method can easily control the film thickness of the resulting nitride layer 12 by controlling the energy and dosage of ion implantation.

The nitridation technique of refractory metal silicide layer can be applied even when the silicide layer is not formed in self-alignment with the semiconductor region formed under the silicide layer. Namely, the silicide layer can be formed by selectively etching using a photolithography technique after the silicide layer is deposited on the whole surface of a substrate by sputtering, co-sputtering, chemical Vapor Deposition and so on.

The present invention is effective even when refractory metal elements other than titanium are used. In this case, the nitride layer may contain nitrogen, the refractory metal and silicon. The annealing temperature and time can be selected appropriately.

What is claimed is:

1. A method of producing a semiconductor integrated circuit device comprising the steps of:
    exposing a part of a surface of silicon on a semiconductor substrate in such a manner that the surface shape of the exposed silicon region is defined by an insulating film;
    depositing a refractory metal at least on said exposed silicon region;
    forming a silicide layer of said refractory metal on said exposed silicon region, said silicide layer being formed by first annealing below 600° C. which lets said silicon react with said refractory metal, and having a relatively high resistance;
    removing said refractory metal other than the one that has contributed to said silicide layer, whereby said silicide layer remains unremoved; and
    effecting a second annealing, in order to change said silicide layer having a relatively high resistance to a silicide layer having a low resistance, said second annealing including an annealing above 900° C. in a nitrogen atmosphere.

2. A method of producing a semiconductor integrated circuit device according to claim 1 wherein said refractory metal is titanium.

3. A method of producing a semiconductor integrated circuit device according to claim 2 wherein said titanium silicide layer after said first and second annealings is comprised principally of TiSi and $TiSi_2$, respectively.

4. A method of producing a semiconductor integrated circuit device according to claim 1 wherein said exposed silicon region is a part of said source and/or drain region of said MISFET, and said insulating film defining the surface shape of said exposed silicon region comprises side wall spacers formed on the side walls of said gate electrode of said MISFET and a thick insulating film formed on said semiconductor substrate in such a manner as to encompass said MISFET.

5. A method of producing a semiconductor integrated circuit device according to claim 1 wherein said second annealing is performed so as to change the surface layer of said silicide layer to a nitride layer.

6. A method of producing a semiconductor integrated circuit device according to claim 5 wherein said nitride layer comprises TiN.

7. A method of producing a semiconductor integrated circuit device according to claim 6 wherein lamp annealing is used as said second annealing.

8. A method of producing a semiconductor integrated circuit device according to claim 1 wherein said silicide layer is formed in self-alignment with the exposed silicon region.

9. A method of producing a semiconductor integrated circuit device according to claim 1 wherein the first annealing is performed in a nitrogen or argon atmosphere.

10. A method of producing a semiconductor integrated circuit device according to claim 9 wherein said removing said refractory metal other than the one that has contributed to said silicide layer comprises etching said refractory metal in an etching solution comprising hydrogen peroxide.

11. A method of producing a semiconductor integrated circuit device according to claim 10 wherein, prior to said second annealing, a low temperature heat treatment, at a temperature below 200° C., is performed to purge the apparatus of oxygen, so as to avoid oxidation of the silicide layer during the second annealing.

12. A method of producing a semiconductor integrated circuit device according to claim 1 wherein said removing said refractory metal other than the one that has contributed to said silicide layer comprises etching said refractory metal in an etching solution comprising hydrogen peroxide.

13. A method of producing a semiconductor integrated circuit device according to claim 1 wherein said second annealing includes two sub-steps, a first sub-step for reducing the resistance of the silicide layer and a second sub-step for forming a nitride layer in a surface layer of the silicide layer.

14. A method of producing a semiconductor integrated circuit device according to claim 1 wherein the silicide layer formed in the first annealing has at least a portion thereof exposed through a connecting hole, and wherein said second annealing is performed so as to turn the titanium silicide layer exposed through the connecting hole into a nitride layer.

15. A method of producing a semiconductor integrated circuit device according to claim 14 wherein said second annealing is performed a sufficient length of time to change the silicide into nitride through the entire depth of the silicide layer.

* * * * *